US008821959B2

(12) United States Patent
Ikushima (10) Patent No.: US 8,821,959 B2
(45) Date of Patent: *Sep. 2, 2014

(54) METHOD FOR APPLYING LIQUID MATERIAL, DEVICE THEREFOR, AND PROGRAM THEREFOR

(75) Inventor: Kazumasa Ikushima, Mitaka (JP)

(73) Assignee: Musashi Engineering, Inc., Tokyo (JP)

( * ) Notice: Subject to any disclaimer, the term of this patent is extended or adjusted under 35 U.S.C. 154(b) by 965 days.

This patent is subject to a terminal disclaimer.

(21) Appl. No.: 12/918,256

(22) PCT Filed: Feb. 18, 2009

(86) PCT No.: PCT/JP2009/000649
§ 371 (c)(1),
(2), (4) Date: Nov. 9, 2010

(87) PCT Pub. No.: WO2009/104383
PCT Pub. Date: Aug. 27, 2009

(65) Prior Publication Data
US 2011/0042478 A1  Feb. 24, 2011

(30) Foreign Application Priority Data
Feb. 18, 2008 (JP) .................. 2008-036628

(51) Int. Cl.
B05B 17/04 (2006.01)
H01L 21/44 (2006.01)
(52) U.S. Cl.
USPC ............................................. 427/8; 438/613
(58) Field of Classification Search
USPC ........... 239/11, 69; 347/5, 6, 9–11, 19; 427/8; 438/5, 7, 613
See application file for complete search history.

(56) References Cited

U.S. PATENT DOCUMENTS

2005/0001869 A1  1/2005 Abernathy et al.
2012/0313276 A1*  12/2012 Ikushima ................. 264/40.1

FOREIGN PATENT DOCUMENTS

| JP | 4-200671 A | 7/1992 |
| JP | 11-97829 A | 4/1999 |
| JP | 2004-344883 A | 12/2004 |
| JP | 3625552 B2 | 3/2005 |
| JP | 2007-007611 A | 1/2007 |

(Continued)

OTHER PUBLICATIONS

International Search Report of PCT/JP2009/000649, mailing date of May 26, 2009.

(Continued)

*Primary Examiner* — Alexander Weddle
(74) *Attorney, Agent, or Firm* — Westerman, Hattori, Daniels & Adrian, LLP (57) ABSTRACT

A method for applying a liquid material in a specific application amount includes an initial parameter setting step of specifying, as a total pulse number, the number of times both ejection pulse signals and pause pulse signals are sent, specifying the number of ejection pulse signals in the total pulse number, which is needed to achieve the specific application amount, and specifying the remainder of the total pulse number as the pause pulse signals; a correction amount calculation step of measuring, per preset correction period, an ejection amount from the nozzle at the timing of the correction period, and calculating a correction amount for the ejection amount; and an ejection amount correction step of adjusting the number of ejection pulse signals and the number of pause pulse signals on the basis of the correction amount calculated in the correction amount calculation step.

16 Claims, 9 Drawing Sheets

⇨ Applying Direction (56) References Cited

FOREIGN PATENT DOCUMENTS

| | | | |
|---|---|---|---|
| JP | 2007007611 A | * | 1/2007 |
| JP | 2007-136450 A | | 6/2007 |
| JP | 2007-313453 A | | 12/2007 |
| TW | 200604017 A | | 2/2006 |

OTHER PUBLICATIONS

Taiwanese Search Report Dated Apr. 30, 2014, issued in corresponding Taiwanese Patent Application No. 098105085 with English translation (4 pages).

* cited by examiner

METHOD FOR APPLYING LIQUID MATERIAL, DEVICE THEREFOR, AND PROGRAM THEREFOR

TECHNICAL FIELD

The present invention relates to a method, a device and a program for applying a liquid material in a specific application amount to a workpiece. More particularly, the present invention relates to a method, a device and a program, which can correct an ejection amount of the liquid material in an underfill step in the field of semiconductor packaging, for example, with no need of computing complex parameters.

BACKGROUND ART

Regarding a technique for ejecting the liquid material in a constant amount, there has hitherto been a problem that, when the ejection is performed for a long time, the liquid material causes a time-dependent change in viscosity thereof and an ejection amount of the liquid material varies.

In view of such a problem, the applicant has proposed an device for ejecting a liquid in a constant amount, wherein an ejection amount is controlled by adjusting an ejection time in an air-type ejection device for applying air under regulated pressure to a liquid material, which is present in a syringe having a nozzle disposed at its fore end, for a desired time (Patent Document 1).

Recently, with further downsizing and higher-density packaging of chips or with more versatility of application work, there have been not only a demand for continuously performing fine application of the liquid material in a very small amount, but also a need for suppressing a variation in the ejection amount of the liquid material to a lower level. Above all, in the underfill step, even finer application of the liquid material in an even smaller amount is required.

Figure 1:
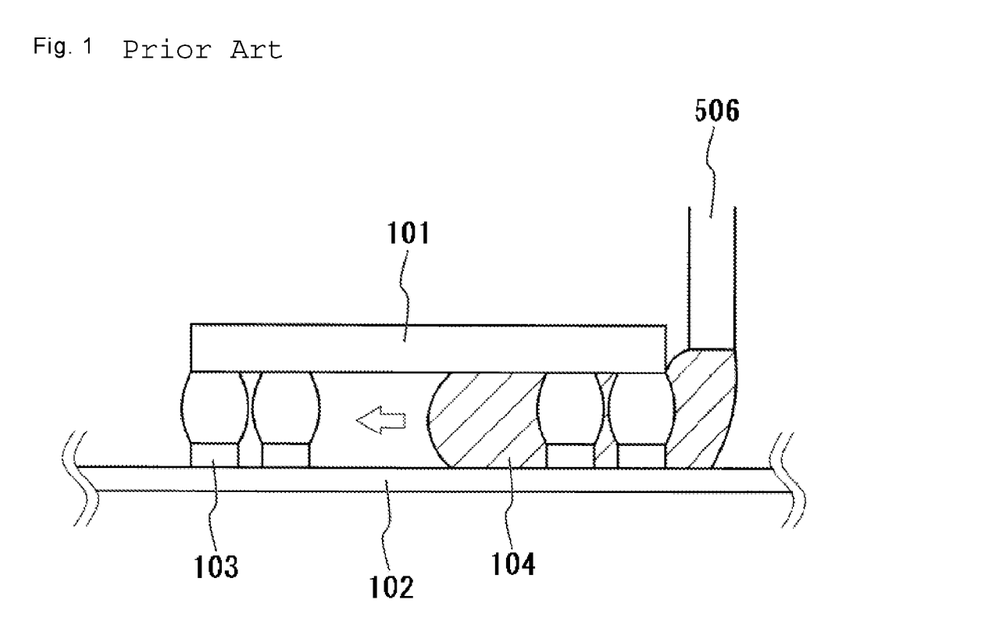
FIG. 1 is a side view to explain an underfill step.

In the underfill step, for the purpose of reinforcing connecting portions 103, a resin 104 as the liquid material is filled into a gap between a semiconductor chip 101 and a substrate 102 by utilizing a capillary phenomenon (see FIG. 1). Therefore, if viscosity of the resin material increases with the lapse of time, a problem arises in that an ejection amount of the resin material through a material ejection port decreases and the capillary phenomenon is insufficiently developed, whereby the material is not filled in an appropriate amount into the gap. In some of various resin materials, which cause large changes in viscosity, the ejection amount decreases 10% or more after the lapse of 6 hours, for example.

A method for carrying out correction of the ejection amount in the underfill step is disclosed in, e.g., Japanese Patent Laid-Open Publication No. 2004-344883 (see Patent Document 2). More specifically, Patent Document 2 discloses a method for ejecting a viscous material onto a substrate by using a jet type dispenser, the method including the steps of preparing a total volume of the viscous material to be ejected and a length over which the total volume of the viscous material is to be ejected, operating the dispenser to apply a plurality of viscous material droplets onto a weight scale, generating a feedback signal representing the weight of the plural viscous material droplets which have been applied onto the weight scale, and obtaining a maximum relative speed between the dispenser and the substrate such that the total volume of the viscous material is ejected over the prepared length.

Also, Patent Document 2 discloses a method further including the steps of obtaining respective volumes of a plurality of viscous material droplets, obtaining a total number of droplets required to provide a volume substantially equal to the total volume, obtaining a distance between adjacent droplets, which is required to distribute the viscous material droplets substantially uniform over the prepared length, and obtaining a maximum relative speed between the dispenser and the substrate such that the total number of viscous material droplets are substantially uniformly ejected over the prepared length.

Patent Document 1: Japanese Patent Laid-Open Publication No. Hei 4-200671
Patent Document 2: Japanese Patent Laid-Open Publication No. 2004-344883

DISCLOSURE OF THE INVENTION

Problems to be Solved by the Invention

However, the device for ejecting the liquid in the constant amount, disclosed in Patent Document 1, is of such an ejection type that the liquid material comes into contact with a workpiece before the liquid material departs from an ejection unit. For that reason, unlike such an ejection type that the liquid material comes into contact with a workpiece after the liquid material has departed from the ejection unit, the liquid material is departed from the ejection unit by moving the ejection unit upwards or by continuing relative movement of the ejection unit through a distance a little longer than the length over which the liquid material is to be applied, after the end of the ejection. Accordingly, there has been a problem of causing a variation in the amount of the applied liquid material because of such a phenomenon that the liquid material is caused to thread between the ejection unit and the workpiece and, when a generated thread is cut, the liquid material to be kept on the ejection unit side is attracted to the workpiece and the ejection amount becomes excessive, or that, to the contrary, the liquid material to be kept on the workpiece side is attracted to the ejection unit and the ejection amount becomes insufficient.

Also, the method disclosed in Patent Document 2 requires procedures to obtain the number of droplets and the interval between the droplets in order to uniformly eject the liquid material over the desired length. Because various parameters are determined by calculations in those procedures, many errors may generate during the calculations.

Further, sizes of individual droplets need to be more exactly the same in order to achieve more uniform ejection with higher accuracy. Any special means is required for that purpose.

In addition, when the viscosity increases, the maximum relative speed between the nozzle (ejection unit) and the substrate is changed in a direction toward a lower speed. The lower speed causes the problem that an application time is prolonged and productivity is affected.

Therefore, an object of the present invention is to solve the problems described above, and to provide a method for applying a liquid material, wherein there is no need to compute complex parameters and there is no influence on the speed of movement of an ejection unit, as well as a device for the application method and a program for the application method.

Means for Solving the Problems

To solve the problems described above, the inventor has tried to simply perform correction of the ejection amount by ejecting the liquid material in pulsed forms and by changing the frequency of a pulse signal. However, experiments conducted using a technique to make the frequency of the pulse signal variable has proved that the correction of the ejection amount cannot be properly performed. In the jet-type dispenser, particularly, when the frequency at which a piston (plunger) is moved up and down is reduced or increased, there may occur such a phenomenon that the liquid material does not depart from the fore end of the nozzle, or that the liquid material departs from the fore end of the nozzle in a state split into two or more droplets. The inventor has found that there is a frequency range of the pulse signal for each of liquid materials, which is optimum for separating one droplet so as to depart from the fore end of the nozzle, and has accomplished the present invention on the basis of the finding.

According to a first aspect of the present invention, in an application method in which a desired application pattern is prepared, a liquid material is ejected from a nozzle while the nozzle and a workpiece are moved relative to each other, and the liquid material is applied in a specific application amount to the workpiece, the application method including an initial parameter setting step of specifying, as a total pulse number, the number of times both ejection pulse signals and pause pulse signals are sent, specifying the number of ejection pulse signals in the total pulse number, which is needed to achieve the specific application amount, and specifying the remainder of the total pulse number as the pause pulse signals; a correction amount calculation step of measuring, per preset correction period, an ejection amount from the nozzle at the timing of the correction period, and calculating a correction amount for the ejection amount; and an ejection amount correction step of adjusting the number of ejection pulse signals and the number of pause pulse signals on the basis of the correction amount calculated in the correction amount calculation step.

According to a second aspect of the present invention, in the application method according to the first aspect of the present invention, the ejection amount correction step corrects the ejection amount without changing a frequency at which the ejection pulse signals and the pause pulse signals are sent.

According to a third aspect of the present invention, in the application method according to the second aspect of the present invention, the frequency is from several tens Hertz to several hundreds Hertz.

According to a fourth aspect of the present invention, in the application method according to any one of the first to third aspects of the present invention, the correction amount calculation step calculates the correction amount for the ejection amount on the basis of both a value obtained by measuring a weight of the liquid material ejected for a certain time and a differential value between the measured value and a theoretical value for the certain time.

According to a fifth aspect of the present invention, in the application method according to any one of the first to third aspects of the present invention, the correction amount calculation step calculates the correction amount for the ejection amount on the basis of both a value obtained by measuring an area and/or a height of the liquid material ejected for a certain time and a differential value between the measured value and a theoretical value for the certain time.

According to a sixth aspect of the present invention, in the application method according to any one of the first to third aspects of the present invention, the correction amount calculation step calculates the correction amount for the ejection amount on the basis of both a value obtained by measuring a width of a fillet of the liquid material, which is formed at an edge of the workpiece having been applied with the liquid material in accordance with the application pattern, and a differential value between the measured value and a theoretical value for the application pattern.

According to a seventh aspect of the present invention, in the application method according to any one of the fourth to sixth aspects of the present invention, an allowable range is set which is used in a step before the correction amount calculation step to determine whether correction is to be made, and the correction amount calculation step calculates the correction amount for the ejection amount when the differential value exceeds the allowable range.

According to an eighth aspect of the present invention, in the application method according to any one of the first to seventh aspects of the present invention, the application of the liquid material is performed in a manner of ejecting the liquid material such that the liquid material comes into contact with the workpiece after the liquid material has departed from the nozzle.

According to a ninth aspect of the present invention, in the application method according to the eighth aspect of the present invention, the application of the liquid material is performed such that the specific application amount of the liquid material is filled into a gap between a substrate and the workpiece placed on the substrate by utilizing a capillary phenomenon.

According to a tenth aspect of the present invention, in the application method according to the ninth aspect of the present invention, the ejection amount correction step reduces the number of ejection pulse signals relative to the number of pause pulse signals when the number of pause pulse signals is increased.

According to an eleventh aspect of the present invention, in the application method according to any one of the first to tenth aspects of the present invention, the correction period is set on the basis of time information, the number of workpieces, or the number of substrates, which is input as the correction period by a user.

According to a twelfth aspect of the present invention, in the application method according to any one of the first to eleventh aspects of the present invention, the ejection amount correction step corrects the ejection amount without changing an application length of the application pattern and a speed of relative movement between the nozzle and the workpiece.

According to a thirteenth aspect of the present invention, in an application apparatus comprising a liquid material supply unit for supplying a liquid material, an ejection unit having an ejection port through which the liquid material supplied from the liquid material supply unit is ejected, a measurement unit for measuring an amount of the liquid material ejected from the ejection port, a drive unit for moving the ejection port and a workpiece relative to each other, and a control unit for controlling operations of the aforesaid units, wherein the control unit includes a program for carrying out the application method according to any one of the first to twelfth aspects of the present invention.

According to a fourteenth aspect of the present invention, there is provided a program for causing a control unit of an application apparatus to carry out the application method according to any one of the first to twelfth aspects of the present invention, the application apparatus comprising a liquid material supply unit for supplying a liquid material, an ejection unit having an ejection port through which the liquid material is ejected, a measurement unit for measuring an amount of the liquid material ejected from the ejection port, a drive unit for moving the ejection port and a workpiece relative to each other, and the control unit for controlling operations of the aforesaid units.

Effect of the Invention

According to the present invention, an application pattern can be freely formed without being restricted from the necessity of uniformly applying the liquid material over the entire length of the application pattern.

Also, procedures are simplified and errors attributable to calculations are less apt to occur in comparison with the case of making correction for each of individual droplets.

Further, since the speed of movement of the ejection device is not changed, no influence is imposed upon the application time.

In addition, since the ejection amount can be corrected without changing the application length and the frequency of the pulse signal, the correction imposes no influence upon quality of the application of the liquid material onto the workpiece.

DESCRIPTION OF REFERENCE CHARACTERS

A legend of main reference characters used in the drawings is as follows:

101 chip, workpiece/102 substrate/103 connecting portion/104 resin, liquid material/141 application region/142 non-application region/301 setting table/401 application device/402 XY drive mechanism/403 weight scale/404 conveying mechanism/501 ejection device/502 control unit/503 pulse signal supply line/504 piston/505 reservoir/506 nozzle/507 compressed air supply line/601 ejection pulse/602 pause pulse/801 image pickup device/901 laser displacement gauge/1001 fillet/S area/H height/W1, W2 width

BEST MODE FOR CARRYING OUT THE INVENTION

In the best mode, the present invention includes the steps of [1] preparing an application pattern, [2] setting initial parameters (i.e., the number of ejection pulses and the number of pause pulses) in the prepared application pattern, and [3] setting a period for correction of an ejection amount that has changed with the lapse of time, for example, and starting application work. The present invention further includes the steps of [4] calculating a correction amount at the timing of the correction period, which has been set in [3], during the application work, and [5] determining whether correction of the ejection amount is necessary, and executing the correction of the ejection amount as required. Those steps will be described in detail below.

[1] Preparation of Application Pattern

An application pattern is prepared in consideration of the application amount, the application length, etc., which are determined depending on the shape of a workpiece. Herein, the term "application amount" means an amount of a liquid material required for drawing the application pattern, and the term "application length" means a total length of relative movement between a nozzle and the workpiece.

The application pattern is made up of one or more ejection pulses 601 and zero or more pause pulses 602. A pulse signal including the ejection pulses 601 and the pause pulses 602 is sent at a predetermined frequency. The frequency and the number of shots/sec are matched with each other in principal. The frequency is preferably not lower than several tens Hertz and more preferably on the order of several hundreds Hertz.

Figure 2:
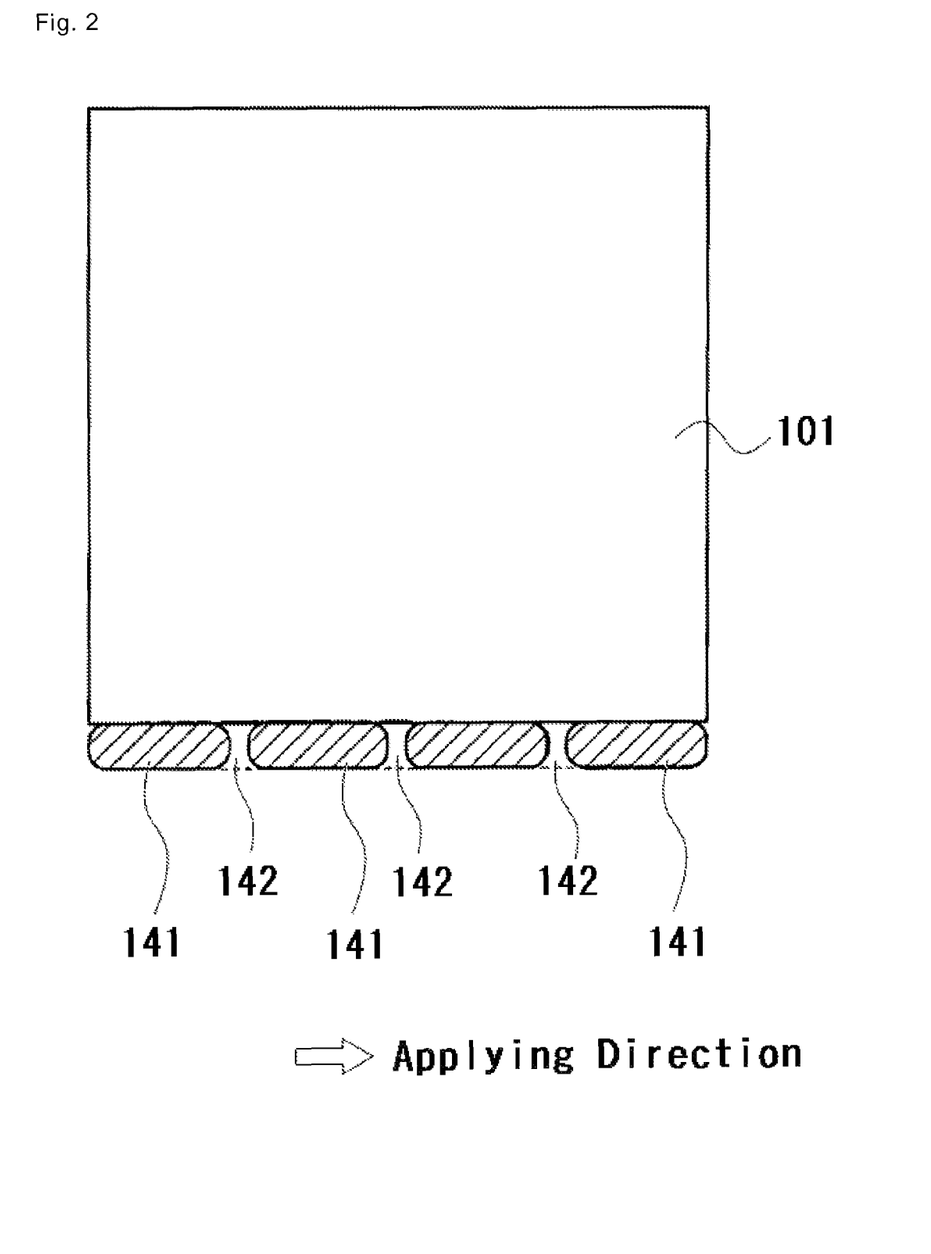
FIG. 2 is an explanatory view illustrating an example of an application pattern.

The preparation of such a pattern that the liquid material is applied to a line extending along one side of a chip 101, i.e., a square workpiece, will be described with reference to FIG. 2. In FIG. 2, an application region 141 corresponds to the ejection pulse 601. The amount of the liquid material ejected to the application region 141 is controlled by setting the ejection pulse 601, whereby the length of the application region 141 is extended or contracted. Further, a non-application region 142 is extended or contracted by setting the pause pulses 602.

Application of the liquid material is not limited to the application along one side of the chip 101, and it may extend along two sides, three sides, or an entire periphery of the chip 101. Further, the workpiece is not limited to a rectangular shape and it may be circular or polygonal.

The total length of the application pattern and the respective numbers of the application regions 141 and the non-application regions 142 are determined from, e.g., the weight or the volume of a liquid material 5, which is required for the desired application pattern. The application region 141 is not limited to a linear shape, and may be provided as a dot pattern in some cases. For example, when, in the underfill step, the size of the chip 101 is small or a yield is to be increased (i.e., when a failure due to entrainment of bubbles is to be reduced), the liquid material may be ejected to one point near a center of a side, or may be ejected for a certain time while a nozzle is kept stopped at a certain location.

[2] Setting of Initial Parameters

The number of ejection pulses 601 and the number of pause pulses 602 are set as initial parameters. The control unit previously stores a setting table 301 in which combinations between the number of ejection pulses 601 and the number of pause pulses 602 are specified.

Table 1 represents one example of the setting table 301 stored in the control unit. In Table 1, a setting example A represents a setting example of the ejection amount when the total pulse number is 100, a setting example B represents a setting example of the ejection amount when the total pulse number is 111, and a setting example C represents a setting example of the ejection amount when the total pulse number is 125. In each of the setting examples A, B and C, the number of ejection pulses corresponds to the ejection amount, and the ejection amount can be adjusted by increasing or decreasing the number of pause pulses in the total pulse number.

The setting example A specifies a setting example in which the ejection amount is changed on the basis of a combination where no pause pulse is set for one ejection pulse (i.e., 0 pause pulse) when the number of ejection pulses is 100.

The setting example B specifies a setting example in which the ejection amount is changed on the basis of a combination where one pause pulse is set for every nine ejection pulses (i.e., 11 pause pulses in total) when the number of ejection pulses is 100.

The setting example C specifies a setting example in which the ejection amount is changed on the basis of a combination where one pause pulse is set for every four ejection pulses (i.e., 25 pause pulses in total) when the number of ejection pulses is 100.

While Table 1 represents an example of combination where the number of pause pulses set for one step is one, it is needless to say that the ejection amount can be controlled with finer resolution by increasing the number of pause pulses set for one step to two or three.

When the number of pause pulses is increased, or when the number of pause pulses is increased or decreased in making later-described correction of the ejection amount, the initial parameters are preferably set such that timings of the pause pulses are spaced at equal intervals.

Additionally, when the number of pause pulses is increased to two or three in the underfill step, it is more preferable, from the viewpoint of preventing entrainment of bubbles, to diminish a gap (i.e., the non-application region) by reducing the number of ejection pulses relative to the number of pause pulses than to enlarge the gap (i.e., the non-application region) by increasing the number of pause pulses in a successive way.

TABLE 1

| | | Setting example A | | Setting example B | | Setting example C | |
|---|---|---|---|---|---|---|---|
| Number of ejection pulses | Number of pause pulses | Number of ejection pulses | Number of pause pulses | Number of ejection pulses | Number of pause pulses | Number of ejection pulses | Number of pause pulses |
| 1  | 0 | 100 | 0  | 111 | 0  | 125 | 0  |
| 10 | 1 | 91  | 9  | 101 | 10 | 114 | 11 |
| 9  | 1 | 90  | 10 | 100 | 11 | 113 | 12 |
| 8  | 1 | 89  | 11 | 99  | 12 | 111 | 14 |
| 7  | 1 | 88  | 12 | 98  | 13 | 110 | 15 |
| 6  | 1 | 86  | 14 | 96  | 15 | 108 | 17 |
| 5  | 1 | 83  | 17 | 92  | 19 | 104 | 21 |
| 4  | 1 | 80  | 20 | 89  | 22 | 100 | 25 |
| 3  | 1 | 75  | 25 | 83  | 28 | 94  | 31 |
| 2  | 1 | 67  | 33 | 74  | 37 | 84  | 41 |
| 1  | 1 | 50  | 50 | 56  | 55 | 63  | 62 |

When the initial parameters are set, an adjustment is preferably started from the combination including the pause pulses instead of starting from the combination including no pause pulses (i.e., the combination including the number of pause pulses=0). In other words, when the parameters are set including one or more pause pulses, the adjustment is adaptable for not only the case where the ejection amount is to be increased, but also the case where the ejection amount is to be decreased. Be it noted that, in the later-described correction, the ejection amount is corrected on condition that the ejection amount at the timing of setting the initial parameters is 100%.

[3] Setting of Correction Period

The correction period, i.e., the timing at which the ejection amount is to be corrected, is set. The correction period is set, for example, as time information, the number of chips 101, or the number of substrates 102, which input by a user. When a predetermined time is set, the time is set at which a change in the ejection amount of the liquid material 104 is expected to exceed an allowable range, counting from the start of the work. When the number of chips or substrates is set, the number of chips or substrates processed is determined from a time required for processing one chip or one substrate (i.e., a time required for loading, application and unloading of one chip or one substrate) and the above-mentioned predetermined time, and is then set.

When the correction period is set, it is preferable to obtain, for the liquid material used in the application, the relationship between an application pattern and a proper weight and/or a proper ejection time in advance based on tests, and to reflect obtained values on setting of the correction period. Although there are influences due to changes in viscosity of the liquid material caused by temperature changes, clogging of the ejection unit, and a water head difference, the initial parameters are adaptable for general changes in the ejection amount by setting those parameters as described above.

Moreover, a value calculated based on the pot life specified by the maker may be stored in advance as a limit value of a usable life of the liquid material and may be incorporated into the correction period.

When the correction period is set, changes in viscosity of the liquid material caused with the lapse of time and temperature changes have to be taken into consideration. However, the following description is made on an assumption that only viscosity changes caused with the lapse of time are generated.

It is a matter of course that the known technique for controlling the viscosity of the liquid material with a temperature adjustment of the ejection unit can also be employed in the present invention in a combined manner.

[4] Calculation of Correction Amount

A correction amount to compensate for the change in the ejection amount caused by the change in viscosity of the liquid material is calculated at the timing of the set correction period.

There are two methods of calculating the correction amount, i.e., (A) a method of measuring the weight of the liquid material after ejecting the liquid material for a certain time, and calculating the correction amount based on a difference between the measured weight and the proper weight, and (B) a method of measuring an ejection time taken until reaching the proper weight, and calculating the correction amount based on a difference between the measured ejection time and the actual ejection time in a just preceding step. While any of those methods can be employed in the present invention, detailed procedures for calculating the correction amount in accordance with the method (A) will be described below.

First, the nozzle is moved to a location above the weight scale, and the liquid material 104 is ejected onto the weight scale from the nozzle held at a fixed position. The liquid material is continuously ejected onto the weight scale for a calculated proper ejection time. The proper ejection time is calculated based on a proper ejection amount that is obtained by ejecting the liquid material over a proper application length at a proper application speed in accordance with the initial setting parameters including the ejection pulses 601 and the pause pulses 602.

Subsequently, a weight $G_1$ of the liquid material 104 ejected onto the weight scale is read. A current ejection amount $V_t$ at the timing of the relevant correction period is obtained by calculating a change rate R ($=(G_1-G_0)/G_0\times100$) from the measured weight $G_1$ and a proper weight $G_0$. When the change rate R is minus, this means that the ejection amount $V_t$ during the proper ejection time is less than the proper weight. Therefore, the setting in consideration of an increase of the ejection amount corresponding to the calculated change rate R is selected from the setting table 301 stored in the control unit, and the respective numbers of ejection pulses 601 and pause pulses 602 after the correction are set. Conversely, when the change rate R is plus, this means that the ejection amount $V_t$ during the proper ejection time is more than the proper weight. Therefore, the setting in consideration of a decrease of the ejection amount corresponding to the calculated change rate R is selected from the setting table 301 stored in the control unit, and the respective numbers of ejection pulses 601 and pause pulses 602 after the correction are set.

[5] Correction of Ejection Amount

When it is determined in above [4] that the correction of the ejection amount is required, the correction is performed by selecting, from the setting table 301 stored in the control unit, the setting in consideration of an increase or a decrease of the ejection amount corresponding to the change rate R, and by changing setting of the respective numbers of ejection pulses 601 and pause pulses 602.

The determination of the ejection amount is preferably executed so as to make the correction only when the difference or the change rate of the measured ejection amount (measured value) in comparison with the proper one exceeds an allowable range (e.g., ±5%), instead of always making the correction when the weight difference or the change rate is not zero. A preferred embodiment of the correction in the case of setting the allowable range is described in detail, for example, in Japanese Patent No. 3877038 granted to the applicant. In short, an allowable range for determining whether correction is to be made or not is set, and an application pattern is corrected only when a differential value or a change rate exceeds the allowable range.

As described above, the optimum application amount can be always realized regardless of changes in viscosity of the liquid material with the lapse of time by executing the above-mentioned steps [4] and [5] at the timing of the correction period which is set in the above-mentioned step [3], or when the type (e.g., the size or the shape) of the substrate is changed.

Details of the present invention will be described in detail below, but the present invention is in no way restricted by the following embodiments.

Embodiment 1

[Application Device 401]

Figure 3:
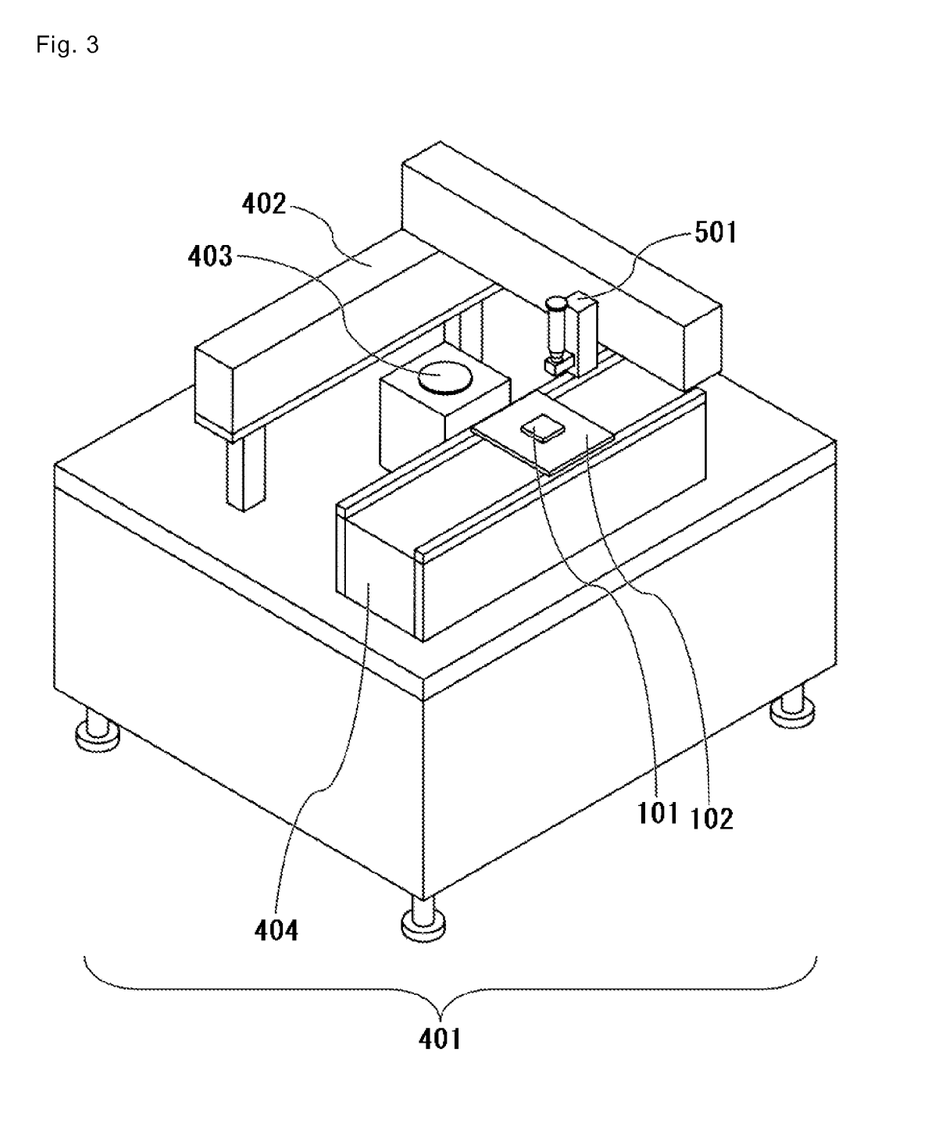
FIG. 3 is a schematic perspective view of a device according to an embodiment.

An application device 401 in this embodiment is an application device used in the underfill step, for example. As illustrated in FIG. 3, the application device 401 includes an ejection device 501, an XY drive mechanism 402, a weight scale 403 serving as a measurement unit, a conveying mechanism 404, and a control unit 502 (though not illustrated in FIG. 3) for controlling operations of the former components.

The ejection device 501 is of the jet type and includes a nozzle 506 for ejecting the liquid material 104. The ejection device 501 is mounted to the XY drive mechanism 402 and is movable to a location above the substrate 102 and a location above the weight scale 403.

The XY drive mechanism 402 can perform the operation of applying the liquid material 104 in the desired pattern while moving in the XY directions above the substrate 102.

At the start of the application, a flip-chip mounted substrate 102, i.e., an application target, is first loaded by the conveying mechanism 404 to a location under the ejection device 501.

The application of the liquid material by the ejection device 501 is started after the substrate 102 has been conveyed to a location under the nozzle 506 and positioning of the substrate 102 has been made. A locus along which the nozzle 506 is to be moved during the application operation, i.e., a basic application pattern, is previously stored in, e.g., a memory inside the control unit 502.

After the end of the application, the substrate 102 is unloaded to the exterior of the application device 401 by the conveying mechanism 404. Subsequently, the next substrate 102 is loaded and the application work is repeated. Thus, the application work is repeated until the application of the liquid material to the desired number of substrates is completed, while the loading, the application, and the unloading are carried out as a series of steps.

During the above-described cycles, the correction of the ejection amount is performed at the timing of the preset correction period. In other words, the ejection amount that has changed due to the change in viscosity of the liquid material 104 is corrected. The correction amount is calculated by moving the nozzle 506 to a location above the weight scale 403 by the XY drive mechanism 402, and by measuring the weight of the liquid material 104 by the weight scale 403. Details of a correction procedure will be described later.

[Ejection Device 501]

Figure 4:
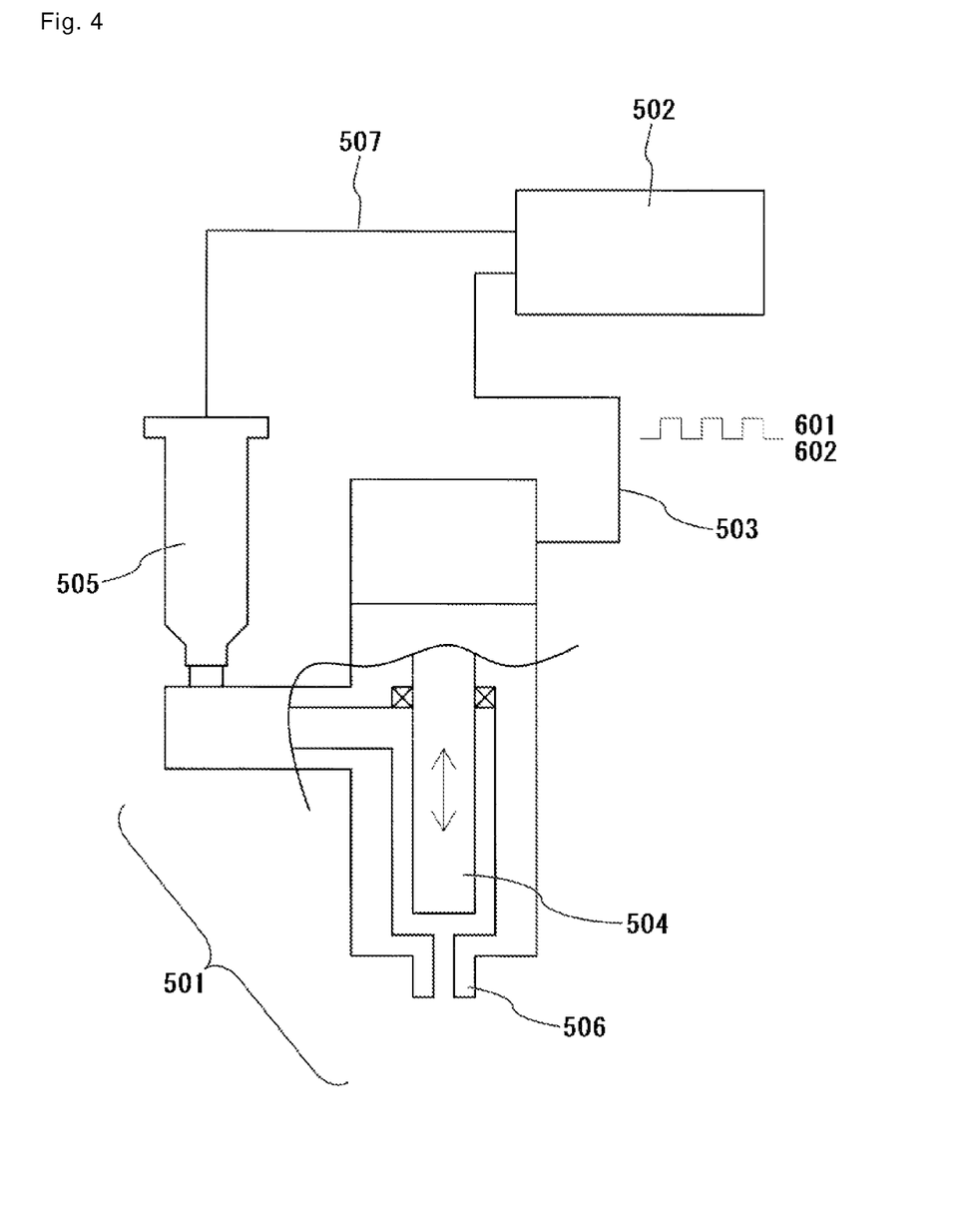
FIG. 4 is a sectional view of principal part of an ejection device according to the embodiment.

As illustrated in FIG. 4, the ejection device 501 includes a piston 504 disposed within the ejection device 501 in a vertically movable state, a reservoir 505 pressurized by compressed gas that is under regulated pressure and that is supplied via a compressed air supply line 507, and the nozzle 506 communicating with the reservoir 505.

The liquid material 104 filled in the reservoir 505 is ejected in the form of a droplet from the nozzle 506 by vertically moving the piston 504 in accordance with the pulse signal (including 601 and 602), which are sent from the control unit 502 via a pulse signal supply line 503. The liquid material 104 having been ejected from the nozzle 506 is applied in the form of a dot to, e.g., the substrate 102 or the weight scale 403, which is positioned under the nozzle 506. Herein, the reservoir 505 is pressurized by the compressed gas that is under regulated pressure and that is supplied from control unit 502 via the compressed gas supply line 507.

The ejection device 501 reciprocates the piston 504 once in response to the one pulse signal 601 and ejects one droplet of the liquid material 104 from the nozzle 506. Thus, one cycle corresponds to one shot.

Figure 5:
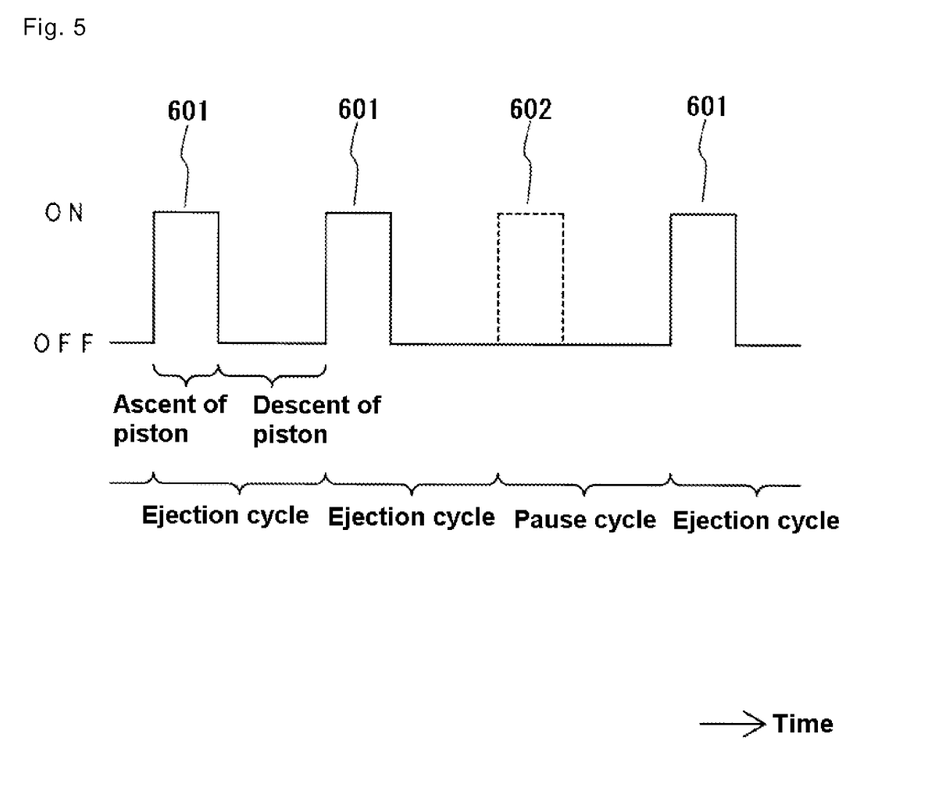
FIG. 5 is an explanatory view to explain a pulse signal sent to the ejection device according to the embodiment.

The pulse signal (including 601 and 602) is provided, by way of example, as illustrated in FIG. 5. More specifically, when the pulse signal is in the on-state (601), the piston is ascended and a nozzle port is opened. Subsequently, when the pulse signal is turned off, the piston is descended and the nozzle port is closed. In this way, one droplet of the liquid material is ejected by one cycle of operation, which is made up of the ascent of the piston (including the opening of the nozzle port) and the descent of the piston (including the closing of the nozzle port). On the other hand, when the pulse signal is in the off-state (602), the piston is not operated and the nozzle port is kept closed for one cycle.

Additionally, a time of the on-state (i.e., an ascent time) and a time of the off-state (i.e., a descent time) in one cycle may be adjusted.

When the application is performed along a side of the workpiece, the control unit 502 sends the pulse signal (including 601 and 602) at the preset frequency to the ejection device 501 at the same time as the start of the application while the nozzle 506 is moved, thereby continuously ejecting the liquid material 104. The liquid material 104 having been ejected along the side of the workpiece is gradually filled into a gap between the workpiece 101 and the substrate 102 by the action of a capillary phenomenon.

The frequency of the pulse signal sent to the ejection device 501 is set based on a mechanical response characteristic of the ejection device 501 and characteristics of the liquid material 104. Although the optimum frequency differs depending on the ejection amount, it is set to, e.g., about 100 to 200 Hertz in many cases.

The ejection amount, etc. are changed by changing the frequency. A characteristic of change in the ejection amount relative to change in the frequency is not linear, and the ejection of the liquid material may be failed depending on conditions. Accordingly, when the ejection amount is corrected during the application work using the same application pattern, it is preferable that the frequency once set is not changed. Thus, this embodiment is featured in that the ejection amount is corrected by adjusting a ratio of the ejection pulses 601 to the pause pulses 602, but the ejection amount is not corrected by changing the frequency of the pulse signal.

[Correction Procedure]

Figure 6:
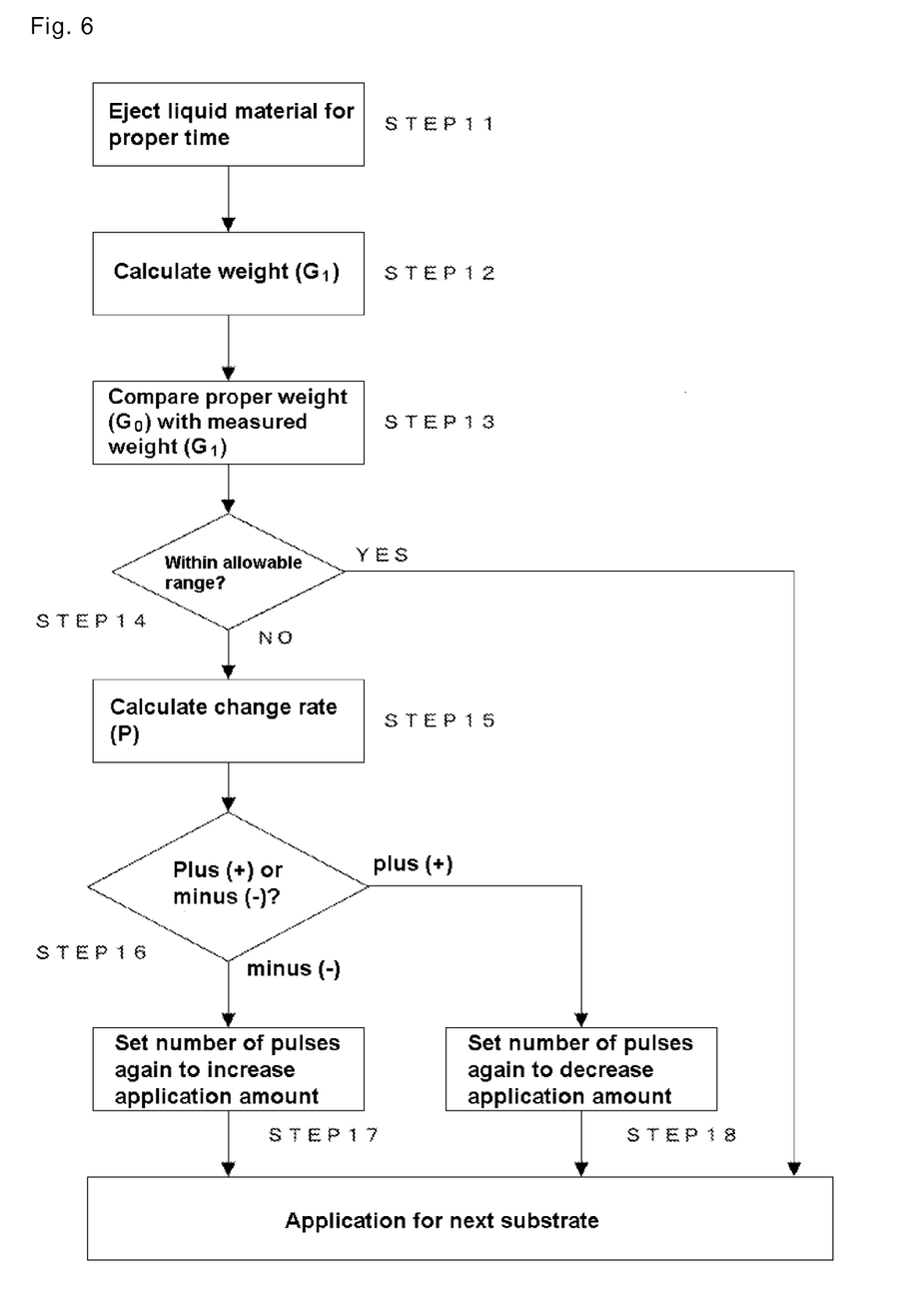
FIG. 6 is a flowchart illustrating a correction procedure according to the embodiment.

FIG. 6 illustrates a flowchart to explain a correction procedure in the embodiment.

First, the liquid material 104 is ejected by sending a plurality of pulses, including the ejection pulses 601 and the pause pulses 602 for the proper ejection time that is determined from both the proper application length and the proper application speed (STEP 11). Next, the weight $G_1$ of the ejected liquid material 104 is measured (STEP 12). Subsequently, the proper weight $G_0$ and the measured weight $G_1$ are compared with each other (STEP 13). The necessity of correction is then determined by confirming whether a weight difference exceeds an allowable range (STEP 14).

If it is determined in STEP 14 that the correction is required, the change rate R ($=(G_1-G_0)/G_0\times100$) is calculated from the proper weight $G_0$ and the measured weight $G_1$ (STEP 15). Whether the change rate R is positive or minus is then determined (STEP 16).

When the change rate R is minus, this means that the ejection amount is less than the proper weight. Therefore, the respective numbers of ejection pulses 601 and pause pulses 602 are set again (STEP 17) by selecting the setting, which takes into consideration an increase of the ejection amount corresponding to the calculated change rate, from the table stored in the control unit.

When the change rate R is plus, this means that the ejection amount is more than the proper weight. Therefore, the respective numbers of ejection pulses 601 and pause pulses 602 are set again (STEP 18) by selecting the setting, which takes into consideration a decrease of the ejection amount corresponding to the calculated change rate, from the table stored in the control unit.

As a modification of the above-described procedure, the necessity of correction may be determined by setting the allowable range in terms of the change rate instead of the weight difference. In such a case, STEP 14 is not executed, and the determination is made between STEP 15 and STEP 16.

According to the above-described device of this embodiment, the ejection amount can be adjusted with no need of considering the properties of the liquid material, etc. by storing various adjustment ratios (i.e., the setting table) that have been previously specified based on calculations. Further, since the application length is not changed with the correction, the shape (e.g., the width) of a fillet can be kept in a stable state.

Embodiment 2

While, in the application device of Embodiment 1, the measurement unit is constituted by the weight scale 403 and the weight of the liquid material 104 is measured, an application device of Embodiment 2 employs a measurement unit in a different form to measure the weight of the liquid material 104.

Figure 7:
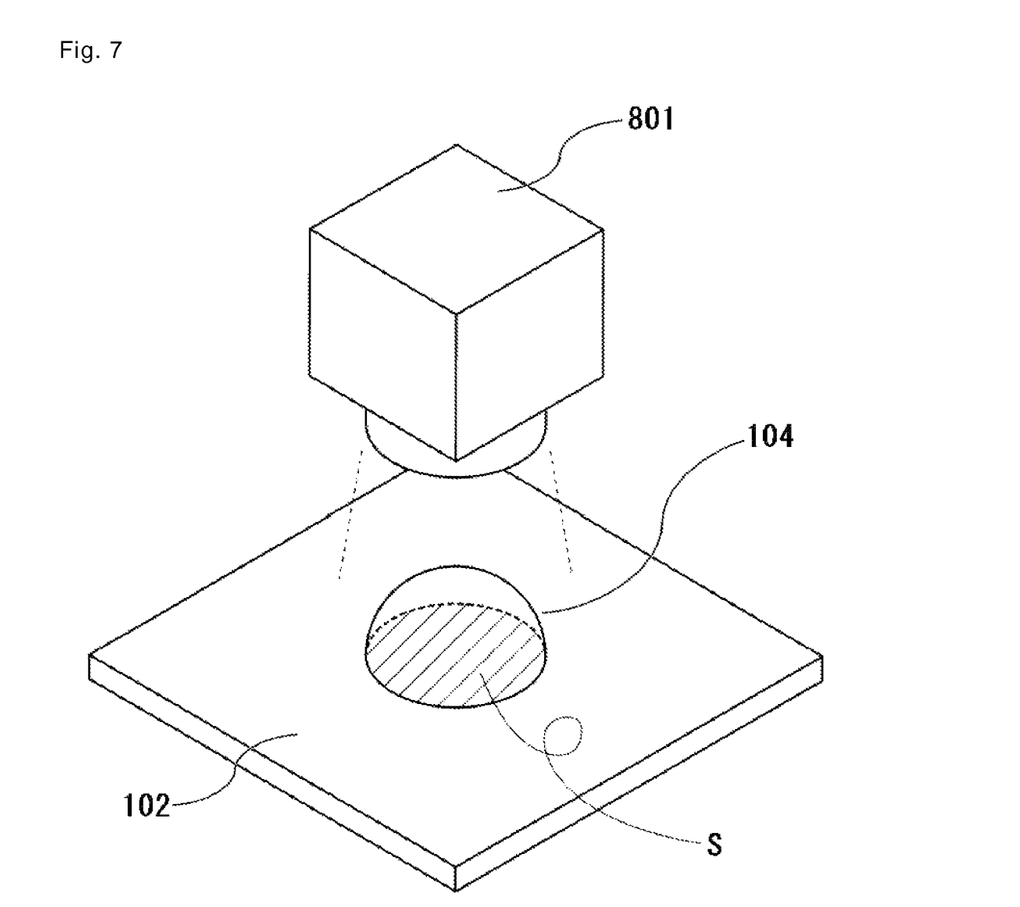
FIG. 7 is an illustration to explain a measurement unit according to Embodiment 2.

In this embodiment, as illustrated in FIG. 7, the liquid material 104 is ejected from the ejection device 501 for a certain time onto an appropriate surface of the substrate 102, for example, thereby forming a surface of the liquid material. An image of the surface of the liquid material is picked up from above by an image pickup device 801, such as a CCD camera, and an area of the liquid material is measured from the picked-up image. The change rate R is calculated based on the measured area, the original ejection amount at the time of setting the initial parameters, and a theoretical value of the ejection amount (i.e., the proper ejection amount) during the above-mentioned certain time. Further, a correction value of the ejection amount is calculated by using the calculated change rate R.

Be it noted that the image pickup device 801 may be integrally provided at a side of the ejection device 501, or may be provided on the XY drive mechanism 402 independently of the ejection device 501.

Embodiment 3

Figure 8:
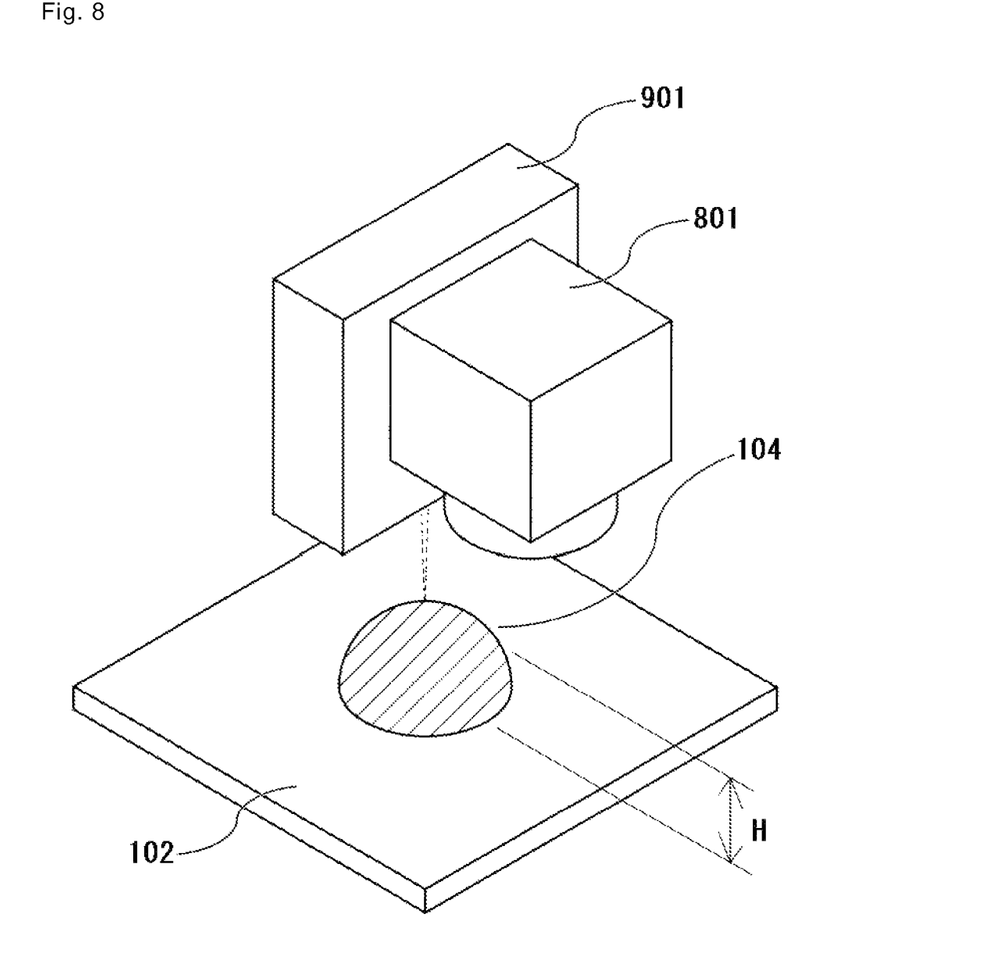
FIG. 8 is an illustration to explain a measurement unit according to Embodiment 3.

An application device of Embodiment 3 differs from the application device of Embodiment 2 in point of measuring the ejection amount for a certain time in terms of volume instead of measuring the ejection amount in terms of area. More specifically, in the application device of this embodiment, as illustrated in FIG. 8, the height of a small droplet of the liquid material 104, which has been applied in the form of a dot onto an appropriate surface of, e.g., the substrate 102, is measured by using a laser displacement meter 901, and the volume of the liquid material is measured by combining the measured height with the area measured by using the image pickup device 801. Further, as in Embodiment 2, the change rate R is calculated based on the measured volume, the original ejection amount at the time of setting the initial parameters, and a theoretical value of the ejection amount (i.e., the proper ejection amount) during the above-mentioned certain time, and a correction value of the ejection amount is calculated by using the calculated change rate R. On that occasion, the correction may be executed by calculating the weight while taking into consideration the density of the liquid material 104, and by using the calculated weight as the measured value.

Be it noted that the laser displacement meter 901 may be integrally provided at a side of the ejection device 501, or may be provided on the XY drive mechanism 402 independently of the ejection device 501.

Embodiment 4

Figure 9:
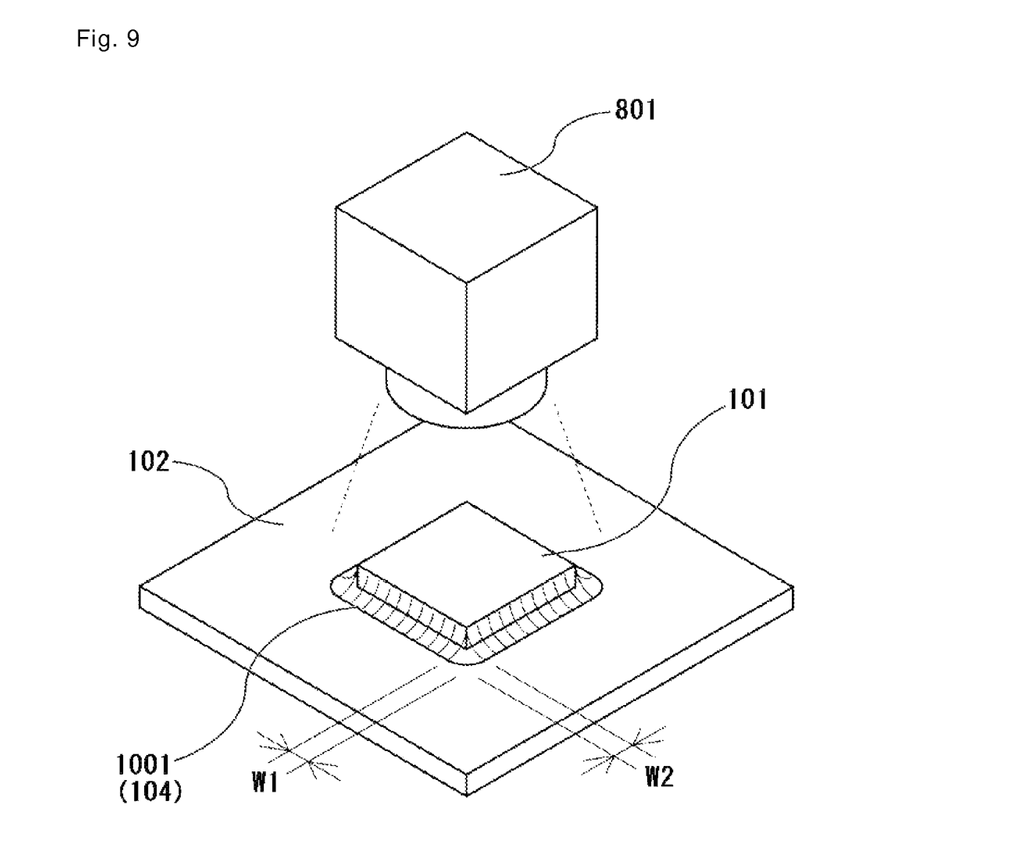
FIG. 9 is an illustration to explain a measurement unit according to Embodiment 4.

An application device of Embodiment 4 is similar to the application devices of Embodiments 2 and 3 in point of including the image pickup device 801, but it differs from them in point of calculating the correction amount based on a width W1 or/and a width W2 of the fillet(s) 1001. More specifically, the application device of this embodiment employs a correction method on an assumption that, during the underfill step in actual production, a width of the fillet 1001, i.e., an amount by which the liquid material 104 protrudes from the workpiece 101, is held within a certain range.

The width W1 or/and the width W2 of the fillet(s) 1001 are measured, as illustrated in FIG. 9, by picking up an image of the workpiece 101, onto which the liquid material has been applied, with the image pickup device 801, and by obtaining, as the width(s) of the fillet(s) 1001, the amount(s) by which the liquid material 104 protrudes from the workpiece 101. The width W1 or/and the width W2 of the fillet(s) 1001 are measured from the image(s) of the fillet(s) 1001 having been subjected to the measurement, and the ejection amount at the current time is calculated. Further, the change rate R is calculated based on the measured ejection amount and the original ejection amount (theoretical value) at the time of setting the initial parameters, and a correction value of the ejection amount is calculated by using the calculated change rate R.

INDUSTRIAL APPLICABILITY

The present invention can be practiced in various types of devices for ejecting liquid materials. For example, the present invention can be practiced in a device of the jet type striking a valve body against a valve seat, thereby causing the liquid material to eject in a way flying from the fore end of a nozzle, a device of the plunger jet type moving a plunger-type plunger and then abruptly stopping the plunger, thereby causing the liquid material to eject in a way flying from the fore end of a nozzle, and a device of the ink jet type operating in a continuous jet mode or on demand.

Further, the present invention can be practiced in various application devices for applying liquid materials in specified application amounts. For example, the present invention can be practiced in a sealant application device and a liquid crystal application device, which are used in steps of manufacturing liquid crystal panels, as well as in a device for applying a solder paste onto a printed board.

The invention claimed is:

1. An application method in which a desired application pattern is prepared, a liquid material is ejected from a nozzle while the nozzle and a workpiece are moved relative to each other, and the liquid material is applied in a specific application amount to the workpiece, the application method including:
    an initial parameter setting step of specifying, as a total pulse number, the number of times both ejection pulse signals and pause pulse signals are sent, specifying the number of ejection pulse signals in the total pulse number, which is needed to achieve the specific application amount, and specifying the remainder of the total pulse number as the pause pulse signals;
    a correction amount calculation step of measuring, per preset correction period, an ejection amount from the nozzle at the timing of the correction period, and calculating a correction amount for the ejection amount; and
    an ejection amount correction step of adjusting the number of ejection pulse signals and the number of pause pulse signals on the basis of the correction amount calculated in the correction amount calculation step.

2. The application method according to claim 1, wherein the ejection amount correction step corrects the ejection amount without changing a frequency at which the ejection pulse signals and the pause pulse signals are sent.

3. The application method according to claim 2, wherein the frequency is from several tens Hertz to several hundreds Hertz.

4. The application method according to claim 1, 2 or 3, wherein the correction amount calculation step calculates the correction amount for the ejection amount on the basis of both a value obtained by measuring a weight of the liquid material ejected for a certain time and a differential value between the measured value and a theoretical value for the certain time.

5. The application method according to 4, wherein an allowable range is set which is used in a step before the correction amount calculation step to determine whether correction is to be made, and
    the correction amount calculation step calculates the correction amount for the ejection amount when the differential value exceeds the allowable range.

6. The application method according to claim 1, 2 or 3, wherein the correction amount calculation step calculates the correction amount for the ejection amount on the basis of both a value obtained by measuring an area and/or a height of the liquid material ejected for a certain time and a differential value between the measured value and a theoretical value for the certain time.

7. The application method according to claim 6, wherein an allowable range is set which is used in a step before the correction amount calculation step to determine whether correction is to be made, and
    the correction amount calculation step calculates the correction amount for the ejection amount when the differential value exceeds the allowable range.

8. The application method according to claim 1, 2 or 3, wherein the correction amount calculation step calculates the correction amount for the ejection amount on the basis of both a value obtained by measuring a width of a fillet of the liquid material, which is formed at an edge of the workpiece having been applied with the liquid material in accordance with the application pattern, and a differential value between the measured value and a theoretical value for the application pattern.

9. The application method according to claim 8, wherein an allowable range is set which is used in a step before the correction amount calculation step to determine whether correction is to be made, and
    the correction amount calculation step calculates the correction amount for the ejection amount when the differential value exceeds the allowable range.

10. The application method according to claim 1, 2 or 3, wherein the application of the liquid material is performed in a manner of ejecting the liquid material such that the liquid material comes into contact with the workpiece after the liquid material has departed from the nozzle.

11. The application method according to claim 10, wherein the application of the liquid material is performed such that the specific application amount of the liquid material is filled into a gap between a substrate and the workpiece placed on the substrate by utilizing a capillary phenomenon.

12. The application method according to claim 11, wherein the ejection amount correction step reduces the number of ejection pulse signals relative to the number of pause pulse signals when the number of pause pulse signals is increased.

13. The application method according to claim 1, 2 or 3, wherein the correction period is set on the basis of time information, the number of workpieces, or the number of substrates, which is input as the correction period by a user.

14. The application method according to claim 1, 2 or 3, wherein the ejection amount correction step corrects the ejection amount without changing an application length of the application pattern and a speed of relative movement between the nozzle and the workpiece.

15. An application apparatus comprising a liquid material supply unit for supplying a liquid material, an ejection unit having an ejection port through which the liquid material supplied from the liquid material supply unit is ejected, a measurement unit for measuring an amount of the liquid material ejected from the ejection port, a drive unit for moving the ejection port and a workpiece relative to each other, and a control unit for controlling operations of the aforesaid units, wherein the control unit includes a computer program for carrying out the application method according to claim 1, 2 or 3.

16. A computer program product embedded in a computer-readable storage medium for causing a control unit of an application apparatus to carry out the application method according to claim 1, 2 or 3, the application apparatus comprising a liquid material supply unit for supplying a liquid material, an ejection unit having an ejection port through which the liquid material is ejected, a measurement unit for measuring an amount of the liquid material ejected from the ejection port, a drive unit for moving the ejection port and a workpiece relative to each other, and the control unit for controlling operations of the aforesaid units.

* * * * *